(12) United States Patent
Urruti

(10) Patent No.: US 9,130,016 B2
(45) Date of Patent: Sep. 8, 2015

(54) METHOD OF MANUFACTURING THROUGH-GLASS VIAS

(71) Applicant: Schott Gemtron Corporation, Sweetwater, TN (US)

(72) Inventor: Eric H. Urruti, Duryea, PA (US)

(73) Assignee: Schott Corporation, Elmsford, NY (US)

( * ) Notice: Subject to any disclaimer, the term of this patent is extended or adjusted under 35 U.S.C. 154(b) by 0 days.

(21) Appl. No.: 13/862,953

(22) Filed: Apr. 15, 2013

(65) Prior Publication Data

US 2014/0306350 A1    Oct. 16, 2014

(51) Int. Cl.
| | |
|---|---|
| H01L 23/48 | (2006.01) |
| H01L 21/768 | (2006.01) |
| H01L 23/498 | (2006.01) |
| H01L 21/48 | (2006.01) |

(52) U.S. Cl.
CPC ........ *H01L 21/76802* (2013.01); *H01L 21/486* (2013.01); *H01L 23/49827* (2013.01); *H01L 23/49833* (2013.01); *H01L 2924/0002* (2013.01)

(58) Field of Classification Search
CPC .......................... H01L 23/486; H01L 23/49827
USPC ...................... 257/59, 774, E21.597, E23.011
See application file for complete search history.

(56) References Cited

U.S. PATENT DOCUMENTS

| | | | | |
|---|---|---|---|---|
| 7,060,602 | B2 * | 6/2006 | Saito .............................. | 438/612 |
| 7,183,650 | B2 * | 2/2007 | Shiono et al. ................. | 257/758 |
| 7,375,009 | B2 * | 5/2008 | Chua et al. .................... | 438/460 |
| 2012/0235969 | A1 * | 9/2012 | Burns et al. ................... | 345/211 |
| 2013/0050227 | A1 * | 2/2013 | Petersen et al. ............... | 345/501 |

\* cited by examiner

*Primary Examiner* — John C Ingham
(74) *Attorney, Agent, or Firm* — Ohlandt, Greeley, Ruggiero & Perle, LLP

(57) ABSTRACT

A method of forming a through-glass via hole involves providing a glass substrate having first and second substantially planar parallel surfaces; masking the first and second substantially planar parallel surfaces to form a via-patterned portion thereon; and etching the via-patterned portion on the first and second substantially planar parallel surfaces to form a first channel in the first substantially planar parallel surface and a second channel in the second substantially planar parallel surface. The first channel and second channel are substantially orthogonal or non-orthogonal to one another. The first channel and the second channel intersect to form a quadrilateral through-glass via hole having via openings at the first and second substantially planar parallel surfaces. A low cost, low complexity and high reliability method for producing a glass substrate having a plurality of through-glass via holes such that the glass substrate can be used, for example, as an interposer.

28 Claims, 7 Drawing Sheets

X > 0.5 Y

METHOD OF MANUFACTURING THROUGH-GLASS VIAS

BACKGROUND OF THE DISCLOSURE

1. Field of the Disclosure

This disclosure relates to a method of manufacturing through-glass vias and, in particular, top and bottom channeling of a glass substrate where the top channels and bottom channels are orthogonal or non-orthogonal to each other, and form aligned holes at the point of intersection, with the holes together forming a through-glass via hole.

2. Discussion of the Background Art

In microelectronics, integrated circuit device density is increasing at a high rate. The number of transistors per chip continues to grow. However, the embodiment of further miniaturization of integrated circuits is costly and the ever more complex circuits require an increasing number of I/O leads, which complicates the contacting and packaging of the devices. Hence, other means for getting higher device density are needed. An emerging alternative is to increase the device density per unit area by stacking devices on top of each other. Currently, stacked devices are mostly interconnected by wire bonding, which is a complex process that requires a large amount of space on the device and unnecessarily long connecting leads. Furthermore, wire bonding commonly gives a fairly high resistance and can be unreliable.

Related to microelectronics are microelectromechanical systems (MEMS), in which the functionality of the microelectronic systems or technologies can be enhanced. In MEMS, integrated circuits are integrated with, e.g., mechanical, chemical, biological functions, or, based on the vast knowledge of microelectronic processing, microelectromechanical systems such as accelerometers, sensors, or biochips are manufactured. Many of these microelectromechanical systems extended in all 3 dimensions in order to obtain the desired functionalities.

As in microelectronics, MEMS structures are mainly fabricated using silicon wafers as substrates, but, e.g., other semiconducting materials, polymers, ceramics and glass are becoming more widely used. Accompanying the increasing interest in making 3D microelectronic and MEMS structures, there is an increasing interest in making electrical interconnects between the front side and the back side of the substrates or wafers of the 3D structure, i.e., so called "through-wafer vias". Using these, unreliable and costly wire bonding is avoided and the interconnect density can be increased. The through-wafer vias should occupy as small area as possible on the wafers and the resistance of the electrical interconnects should be low. Furthermore, the processing of the through wafer vias should be compatible with conventional processing technologies in the field.

Different through-wafer via designs have been disclosed, and the strategy for making the via can be divided into two categories. In the first category, the through-wafer vias are formed by the wafer material, e.g., a doped semiconductor via. In the second category, a through-wafer via hole is formed in the wafer using, for example, laser ablation, drilling, wet etching or dry etching. Thereafter, a conductive material is deposited, e.g., using a physical vapour deposition (PVD) process, on at least the sidewalls of the through-wafer via hole. To increase the cross sectional area of the conductive through-wafer via (in order to reduce the electrical resistance) a metal or metal alloy is commonly plated onto the conductive coating. Through-wafer vias of the first category generally have a relatively high resistance as compared to through-wafer vias of the second category due to the higher conductivity of the metal or metal alloy.

The technique used for the formation of the via hole mainly depends on the wafer material. Silicon is used as an interposer having through-hole electrodes now. Silicon is relatively easily subjected to microfabrication by dry etching. However, since silicon is semiconductor, an inner wall of the through-holes has to be subjected to insulating treatment in order to secure the insulating property. Glass is being considered as an interposer. The advantages of glass include good insulation, matched CTE, smooth uniform surface, low dielectric constant, and low cost materials. However, it is difficult and expensive to form through-holes through a glass substrate, e.g., it is usual to use laser, sandblasting or ultrasonic wave drill to form through holes. In such a case, it is difficult and expensive to form micro through-holes, and the application of such a glass substrate is limited now.

The microelectronics industry has had a great deal of trouble forming good via holes inexpensively. As mentioned above, numerous methods have been tried with glass substrates including mechanical techniques such as drilling or sand blasting, chemical methods such as wet etching and photo sensitive glass, laser ablation methods, and electrical discharge methods. Via holes have been produced, but the complexity and cost structure of generating the through-via hole in a glass substrate are major obstacles. Low cost with very high reliability is an absolute driver for the microelectronics industry, especially the production of glass substrates having through-glass via holes for use as interposers.

There is a need to provide a glass substrate having a plurality of through-glass via holes suitable for various semiconductor devices, e.g., useful as an interposer. There is a need to provide a low cost, low complexity and high reliability method for producing a glass substrate having a plurality of through-glass via holes such that the glass substrate can be used as an interposer.

The present disclosure also provides many additional advantages, which shall become apparent as described below.

SUMMARY OF THE DISCLOSURE

This disclosure relates in part to a method of forming a through-glass via hole. The method comprises providing a glass substrate having first and second substantially planar parallel surfaces; masking the first and second substantially planar parallel surfaces to form a via-patterned portion thereon; and etching the via-patterned portion on the first and second substantially planar parallel surfaces to form a first channel in the first substantially planar parallel surface and a second channel in the second substantially planar parallel surface. The first channel and second channel are substantially orthogonal or non-orthogonal to one another. The first channel and the second channel intersect to form a quadrilateral through-glass via hole having via openings at the first and second substantially planar parallel surfaces. Changing the geometry such that the channel etching deviates from being orthogonal would result in through glass vias that are non-orthogonal, e.g., more diamond shaped than squares or rectangles.

This disclosure also relates in part to an electrical device that comprises a glass substrate having first and second substantially planar parallel surfaces; and a first channel in the first substantially planar parallel surface and a second channel in the second substantially planar parallel surface. The first channel and second channel are substantially orthogonal or non-orthogonal to one another. The first channel and the second channel intersect to form a quadrilateral through-glass via hole having via openings at the first and second substantially planar parallel surfaces.

An advantage of the present disclosure is a low cost, low complexity and high reliability method for producing a glass substrate having a plurality of through-glass via holes such that the glass substrate can be used, for example, as an interposer.

Further objects, features and advantages of the present disclosure will be understood by reference to the following drawings and detailed description.

DETAILED DESCRIPTION OF THE PREFERRED EMBODIMENT

Figure 1:
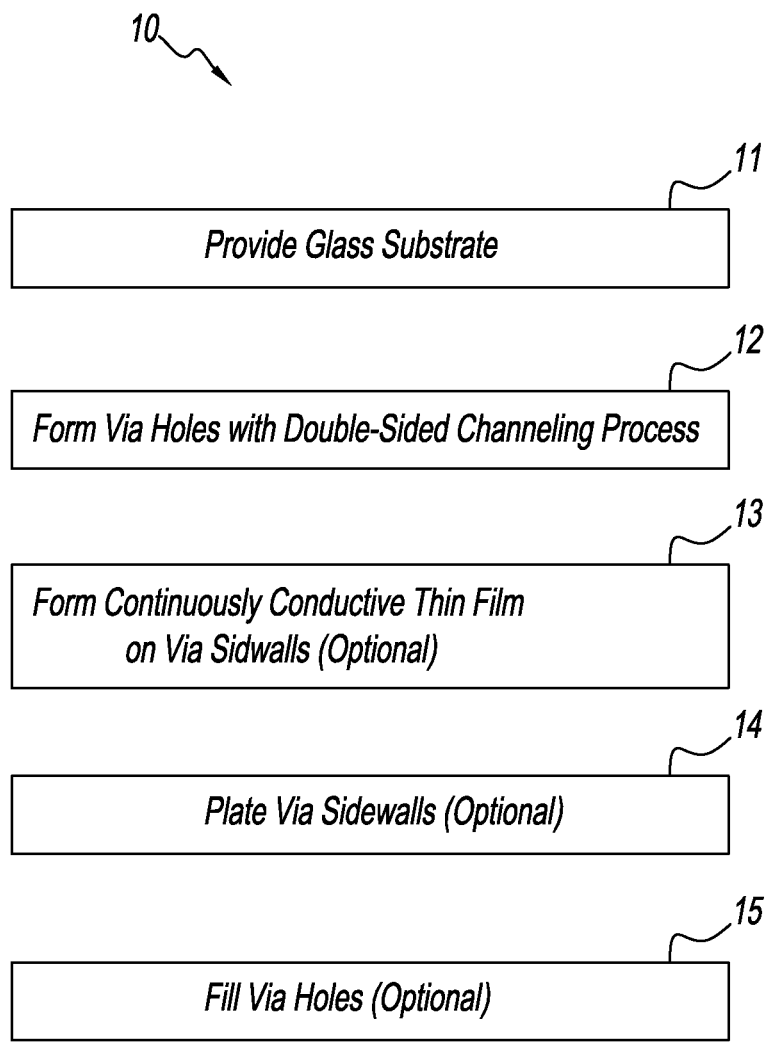
FIG. 1 is a flow diagram illustrating a process for forming a through-glass via that involves double-sided channeling to form aligned holes in a glass substrate with the holes together forming a through-glass via hole.

For the purpose of this disclosure, the term "electronic device" refers to microelectronic devices, electronic MEMS devices, electronic nanotechnology devices, as well as simpler electronic devices. A microelectronic device may comprise microelectronic components such as integrated circuits integrated in the wafer surface or arranged on the surface of the wafer. A MEMS device may be formed by micromachining of, e.g., a semiconductor wafer or surface micromachining on a wafer. The simpler electronic device may be a substrate used as a carrier for electronic components or an intermediate layer between other electronic devices.

Some embodiments described in this disclosure relate to glass packaging of electronic devices, e.g., MEMS devices, and other devices. Through-glass vias, which are electrical connections extending through a glass panel or other glass substrate, and related fabrication methods are described herein. While embodiments of the methods of fabrication and the resulting through-glass vias are described in the context of glass packaging of MEMS and IC devices, the methods and vias are not so limited and may be implemented in other contexts that employ, e.g., a conductive path through a glass substrate.

Through-glass vias can be provided in glass substrates having thicknesses of at about 100-700 microns. The through-glass vias include a conductive pathway extending through the glass substrate. In an embodiment, the through-glass vias can include a thin film coating all or a portion of the sidewalls of a through-glass via hole. Also, the through-glass vias can include a plated metal coating all or a portion of the sidewalls of a through-glass via hole. The through-glass vias can be unfilled or include conductive or non-conductive fill materials according to the desired embodiment.

A through-glass via can be provided in a planar glass substrate. The through-glass via can include a sidewall extending from a planar surface of the glass substrate to a point in the interior of the glass substrate. A through-glass via sidewall can have sidewalls extending from opposing planar surfaces of the glass substrate and intersecting at a point in the interior of the glass substrate. A through-glass via hole can have via openings in opposing surfaces of a glass substrate and an interior dimension that is essentially the same as, or less than, the corresponding dimension at each via opening.

In accordance with this disclosure, a glass substrate can include a through-glass via that, alone or in combination with contact pads, metal traces, and the like, electrically connects one or more of a MEMS device, IC device, sensor, circuitry, via, contact pad, SMD pad, or other electrically active device or conductive material on one side of the glass substrate to one or more of a MEMS device, IC device, sensor, circuitry, via, contact pad, SMD pad, or other electrically active device or conductive material on the other side of the glass substrate.

Methods of fabricating double-sided channels and through-glass vias are described herein. The methods involve double-sided channeling processes to form aligned holes in a glass substrate with the holes together forming a through-glass via hole. In an embodiment, the methods involve single-sided or double-sided deposition of a continuous conductive thin film on the sidewalls of a through-glass via hole. Forming a through-glass via hole can involve channeling the glass substrate by wet etching. The methods described herein can involve plating sidewalls of the through-glass via hole and/or filling the through-glass via hole with a conductive or non-conductive fill material according to the desired embodiment.

The method of this disclosure includes double-sided channeling processes to form aligned via holes in a glass substrate that together form a contoured through-glass via hole, optionally followed by deposition or depositing an electrically conductive material. Double-sided channeling methods of forming the through-glass via hole include wet etching, dry etching, sandblasting or a combination of these techniques, preferably wet etching to form the channels. Forming a through-glass via hole includes etching a via-patterned portion on the first and second glass surfaces to form a first channel in the first glass surface and a second channel in the second glass surface; in which the first channel and second channel are substantially orthogonal or non-orthogonal to one another; and in which the first channel and the second channel intersect to form a quadrilateral through-glass via hole having via openings at the first and second glass surfaces. Non-orthogonal etching will yield more diamond shaped vias.

The through-glass via hole is preferably a direct line-of-sight region that facilitates deposition of a continuous conductive thin film through the through-glass via hole. Single-sided or double-sided sputtering or other deposition techniques may be used to deposit a thin film in the through-glass via hole. Via metal thickness may be augmented with electro- or electroless plating. The thin-film through-glass vias may optionally be filled, for example, with an electrically conductive material, a non-electrically conducting material, or a thermally conductive material. Alternatively, the through-glass via hole is filled with precision bead or rods of an appropriately conductive material with the use of a vibration table to expedite the process.

In accordance with this disclosure, a through-glass via includes a hole through a glass substrate (referred to as a through-glass via hole) formed by double-sided channeling processes, and optionally a thin conductive film that conformably coats the sidewalls of the through-glass via hole. The through-glass via hole in a glass substrate having first and second sides is formed by a double-sided channeling process that forms a first via hole having sidewalls and a via opening in the first side of the glass substrate and a second via hole having sidewalls and a via opening in the second side of the glass substrate. The first and second via holes intersect (the confluence), with the sidewalls of each of the first and second via hole essentially vertical from their respective via openings to the intersection of the first and second via holes. A dimension of the through-glass via hole at the intersection is essentially the same as, or less than, the corresponding dimension at each via opening. The dimension of each via opening can be greater or less than the thickness of the glass substrate.

The through-glass via hole can be optionally coated with a plated metal film that is continuous from the first side of the glass substrate to the second side. An interior of a through-glass via hole may be unfilled, partially filled or wholly filled. For example, a through-glass via hole may be partially or substantially filled with one or more of an electrically conductive material, a thermally conductive material, or a non-conductive material.

The first and second via holes may each have a constant or variable radius. For example, the via openings may be quadrilateral or otherwise shaped. A via opening dimension may be, for example, a width of a quadrilateral opening. The thickness of the conductive thin film can be between about 0.1 and 5 microns, and more particularly between, e.g., 0.1 and 0.2 microns. The substrate glass thickness can be at least about 20 microns, and more particularly, e.g., at least about 100 microns or at least about 300 microns or at least about 500 microns.

An electronic device such as an integrated circuit (IC) or MEMS device can be mounted on the first side of the glass substrate and electrically connected to the conductive thin film in the through-glass via hole. An electrical component on the second side of the glass substrate may be connected to the IC or MEMS device through the conductive thin film in the through-glass via hole. An electrical device includes a display, a processor configured to communicate with the display and configured to process image data and a memory device configured to communicate with the processor.

This disclosure includes an electrical device with a glass substrate having first and second sides, a MEMS or IC device mounted to the first side of the glass substrate, and a conductive thin film in the through-glass via hole for electrically connecting the MEMS or IC device to the second side of the glass substrate.

The method of this disclosure can involve aligning stencil patterns on the first and second surfaces of the glass substrate and wet etching or sandblasting the substrate in accordance with the aligned stencil patterns. The wet etching is of the first and second via holes to form a direct line-of-sight region extending from the intersection of the first and second via holes.

Optionally, coating the through-glass via hole with a conductive thin film may involve deposition from two sides of the glass substrate, or only one side. In an embodiment, a metal layer can be plated on the conductive thin film. Also, the methods involve wholly or partially filling the through-glass via hole.

Figure 2:
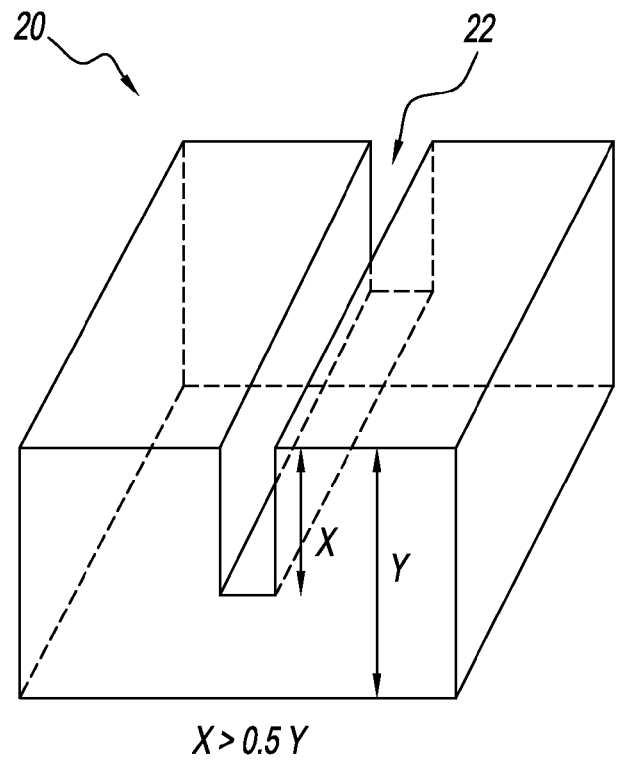
FIG. 2 is a schematic illustration of a stage in the double-sided channeling method of forming a through-glass via, in particular, a schematic representation of a glass substrate 20 in which etching from the top produces a channel 22 on the top of the glass substrate.
Figure 3:
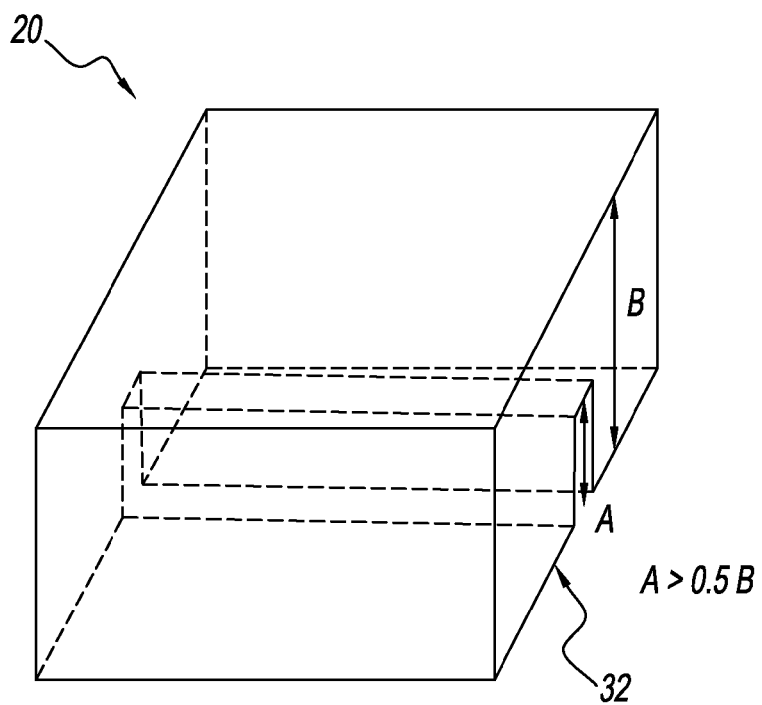
FIG. 3 is a schematic illustration of a stage in the double-sided channeling method of forming a through-glass via, in particular, a schematic representation of a glass substrate 20 in which etching from the bottom produces a channel 32 on the bottom of the glass substrate.
Figure 4:
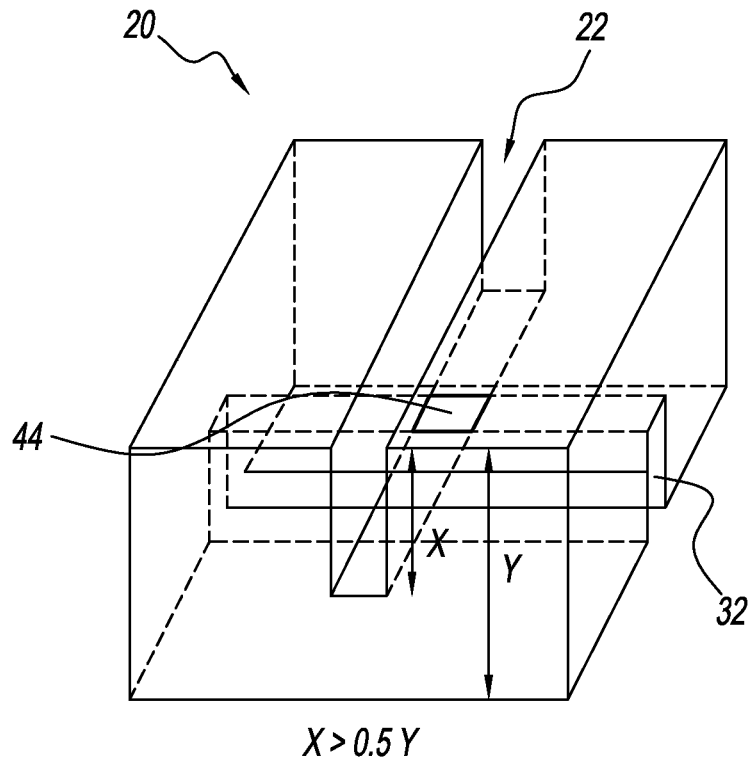
FIG. 4 is a schematic illustration of a stage in the double-sided channeling method of forming a through-glass via, in particular, showing that by combining the masking and etching on the top and bottom surfaces of the glass substrate 20, an intersection point of the two etch channels 22 and 32 (the confluence) provides a source of where the glass substrate is completely etched away and a via 44 is formed.

FIG. 1 shows an example of a flow diagram of a process for forming a through-glass via that involves double-sided channeling to form aligned holes in a glass substrate with the holes together forming a through-glass via hole. FIGS. 2-4 show examples of various stages in the double-sided channeling method of forming a through-glass via. First turning to FIG. 1, method 10 starts with an operation 11 in which a glass substrate is provided. Thicknesses of the glass substrate according to various embodiments are described herein. The substrates may be any appropriate area. A glass substrate (sometimes referred to as a glass plate or panel) having an area, for example, on the order of one square meter or greater is provided with a thickness, for example, of 0.3, 0.5, or 0.7 millimeters. Alternatively, round substrates with diameters of 100 millimeters, 150 millimeters, or other diameters may be provided. Square or rectangular sub-panels cut from a larger panel of glass may be provided. The glass substrate may be or include, for example, a borosilicate glass, a soda lime glass, quartz, Pyrex, or other suitable glass material. The glass substrate may be provided with or without MEMS devices and/or other components (metal traces, contact pads, circuitry, etc.) already fabricated on one or both sides of the substrate. The MEMS devices and/or other package components are formed after formation of the through-glass vias, or at any appropriate point during formation of the through-glass vias.

In an operation 12, a double-sided channeling process is performed to form through-glass via holes in the glass substrate. The double-sided channeling process involves forming two partially through holes (i.e., channels), one on each side of the glass substrate. At some point during or after formation of these two holes (i.e., channels), they are joined by etching or otherwise removing glass material between them. The two partially through holes are aligned such that when joined, the aligned through holes overlap near a mid-section of the glass substrate, forming the through-glass via hole. The double-sided channeling processes can involve simultaneous wet or dry etching of aligned partially through holes, sequential wet or dry etching of aligned partially through holes, and simultaneous or sequential sandblasting (also known as powder blasting) of aligned partially through holes. A double-sided channeling process can involve a double-sided sandblasting process followed by a wet etching process to further shape and contour the via holes. The via holes can be shaped to facilitate subsequent deposition of a continuous thin film through the via holes from one or both sides of the glass substrate.

Turning to FIGS. 2-4, a representation of a through-glass via hole formed by a double sided channeling process in a glass substrate is depicted. The through-glass via hole includes aligned quadrilateral shaped via holes formed in the glass substrate. The quadrilaterally shaped via holes may be formed by etching the glass substrate with an isotropic wet chemical etchant such as a hydrofluoric acid based etchant.

The glass substrate can be masked and a channel etched therein as shown in FIGS. 2-4. FIG. 2 shows a representation of a glass substrate 20 in which etching from the top produces a channel 22 on the top of the glass substrate. Similarly, FIG. 3 shows a representation of a glass substrate 20 in which etching from the bottom produces a channel 32 on the bottom of the glass substrate. Referring to FIG. 4, by combining the masking and etching on the top and bottom surfaces of the glass substrate 20, an intersection point of the two etch channels 22 and 32 (the confluence) provides a source of where the glass substrate is completely etched away and a via 44 is formed. The top and bottom channels 22 and 32 etched in FIGS. 2 and 3 are orthogonal to each other.

Figure 5:
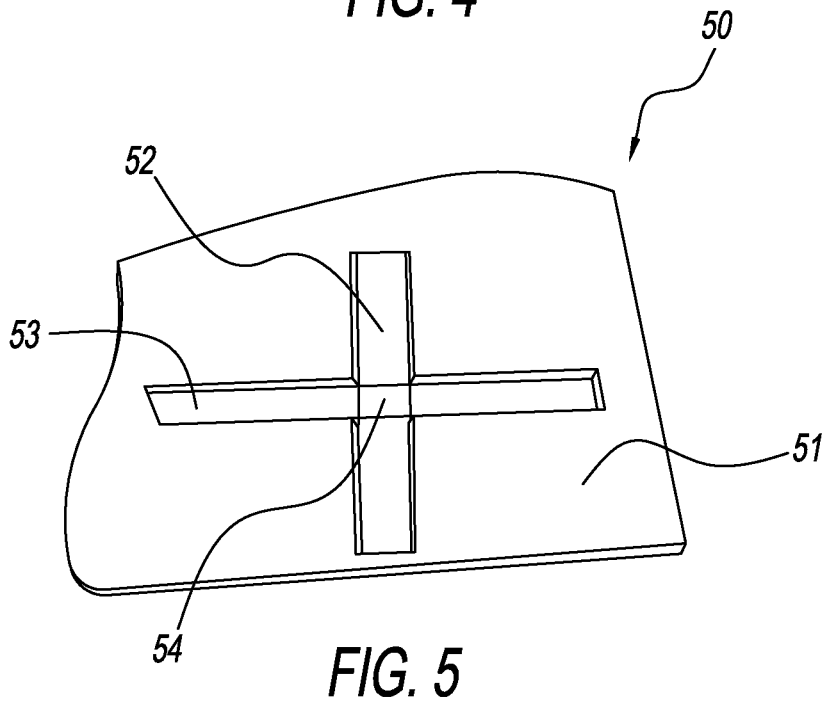
FIG. 5 shows an example of a simplified cross-sectional illustration of a glass substrate having a through-glass via.

FIG. 5 shows a glass substrate 50 having a crude mask 51 of paraffin wax on the top and orthogonally on the bottom of a glass substrate, followed by a glass etch step, as described in the Examples. An etched channel 52 on the bottom and an etched channel 53 on the top meet at a point of intersection (the confluence point), and a through-glass via 54 is formed.

The method of this disclosure can be a traditional photolithographic process where one protects the areas not intended to be etched, and leaves areas to etch unprotected. This would be followed by simple acid etch, washing, followed by removal of the photolithography if desired. Etch saturation that generates a tapered hole will be prevented as the liquid is free flowing. This will aid in uniform and rapid etching across the entire surface providing a more consistent surface along with rapid manufacturing.

The method of this disclosure can be operated with conventional equipment. All the tools and equipment required to conduct the double-sided channeling process are readily available. The method of this disclosure allows one to select from a vast array of glass substrates offering the lowest price possible. The technique used in this disclosure is completely scalable to allow the use of the tooling available along with taking advantage of the low cost glass manufacturing processing that has been developed for the LCD market. The method of this disclosure provides a low cost solution to the market.

Returning to FIG. 1, after forming the through-glass via holes, process 10 continues by coating the sidewalls of the via holes with a continuously conductive thin film in operation 13. One or more thin films can be deposited by a sputter deposition process (also known as a physical vapor deposition (PVD) process). The sidewalls can be coated by a chemical vapor deposition (CVD) process, an atomic layer deposition (ALD) process, or an evaporation process. Operation 13 can be a one-sided deposition process. For example, operation 13 can be a one-sided sputtering process in which a target positioned above one surface, or the other, of a substrate including a through-glass via hole is sputtered to deposit the target material on the surface of the substrate and on the sidewalls of both the upper and lower via holes. Conductive thin film material enters the through-glass via hole only through the via opening in that surface. Operation 13 can be a two-sided process in which material is deposited in a through-glass via hole through each via opening, either simultaneously or sequentially.

A thin film coating can be applied to the sidewalls of through-glass via hole. The thin film coats the sidewalls of through-glass via hole continuously from the top surface to the bottom surface of glass substrate. All or only a portion of the through-glass via hole can be coated through one or both via openings with a conductive thin film that is electrically continuous through the via hole. The thin film can also be deposited on the top and bottom surfaces of glass substrate. The thin film may be selectively patterned and etched on one or both sides of glass substrate to form, for example, electrical traces, bond pads, and other connective features.

Returning to FIG. 1, deposition of the thin film is complete after operation 13. In an embodiment, one or more additional metal layers can be formed by electroless plating or electroplating on the conductive thin film in an optional operation 14. If plating is performed, the layers deposited in operation 14 may be used as seed layers for the subsequent plating operation 15. Electroplating may be performed, for example, through a plating mask such as a thick photoresist layer or a dry-resist film laminated to or otherwise formed on one or both sides of the glass substrate. Alternatively, a self-seeding plating method may be used. Plating may be used to effectively increase the thickness of the thin metal film in the through-glass via and decrease the via resistance. Plated materials may be used to fill or partially fill the via hole. The thickness of the plated layer may range, for example, from a few microns to hundreds of microns. The plated layer thickness can be between 3 and 30 microns.

Thicknesses of the thin films formed in operation 13 may range from less than 0.05 to over 5 microns. In some cases, the thickness of a thin film layer on the sidewalls of a through-glass via hole depends on whether plating is to be performed. In embodiments in which a thin film provides the electrical connection through the via (i.e., the via hole is unfilled or filled with a non-conductive material), the film may be deposited to a thickness between about 0.1 and 5 microns, e.g., 1 micron or 2 microns. In embodiments in which a thin film is a seed layer for a plating process, it may be deposited to a thickness of about 0.1 to 0.2 microns. One having ordinary skill in the art will understand that these thicknesses may be varied depending on the desired embodiment.

The thin film is generally a metal, although conductive polymers or other materials may be used. Examples of metals include copper (Cu), aluminum (Al), gold (Au), niobium (Nb), chromium (Cr), tantalum (Ta), nickel (Ni), tungsten (W), titanium (Ti) and silver (Ag). Depositing the thin film involves depositing a bilayer including an adhesion layer and second layer such as aluminum, gold, copper or another metal. The second layer acts as the main conductor and/or seed layer. Adhesion layers promote adhesion to the glass substrate. Examples of adhesion layers include chromium and titanium. Examples of bilayers include Cr/Cu, Cr/Au and Ti/W. Adhesion layers may have thicknesses of a few nanometers to several hundred nanometers or more.

In addition to coating the inside surface of a via hole, a thin film may be deposited on one or both of the top and bottom surfaces of the glass substrate, in at least a portion of the area surrounding the via opening in that surface. The films formed on the top and/or bottom surface may be patterned and etched to form electrical traces and/or contact pads that are electrically connected to the via hole. The patterning and etching may be performed after operation 13 or 14, as described with respect to FIG. 1. A deposition mask can be formed on a top and/or bottom surface prior to deposition of the thin film so that the films are deposited in the desired pattern. The thin metal films also may be deposited to connect to existing metal traces and other features on the top and/or bottom surfaces.

The thin films formed in operation 13, and, if present, the plated layers formed in operation 14, provide conductive paths through the via, with the interior of the via hole left unfilled or subsequently filled or partially filled with a non-conductive material. The vias can be filled or partially filled by a metal or other conductive material. Accordingly, after deposition of one or more thin films in operation 13 and, if performed, plating in operation 14, the via holes can be completely or partially filled with a conductive or non-conductive material in an optional operation 15.

The filler material may be a metal, a metal paste, a solder, a solder paste, one or more solder balls, a glass-metal material, a polymer-metal material, a conductive polymer, a non-conductive polymer, an electrically conductive material, a non-conductive material, a thermally conductive material, a heat sink material, or a combination thereof. The filler material reduces the stress on the deposited thin film and/or plated layer. The filler material seals the via holes to prevent transfer of liquids or gases through the via holes. The filler material may serve as a thermally conductive path to transfer heat from devices mounted on one side of the glass substrate to the other. The via holes may be filled or partially filled using a process such as plating, a squeegee-based process, dispensing or direct writing a filler material, screen printing, spray coating, or other appropriate via fill process. Where the thin films are deposited on the top and/or bottom surfaces of the glass substrate, the thin films may be patterned and etched prior to or after the via holes are filled.

Once the process described herein with reference to FIGS. 1-4 is complete and the through-glass vias are formed, the glass substrate may be further processed by additional deposition, patterning and etching sequences to form electrical connections, devices, or other features. Moreover, the glass substrate may be further processed by attaching other devices or substrates, or by dicing and further packaging as desired.

Figure 6A:
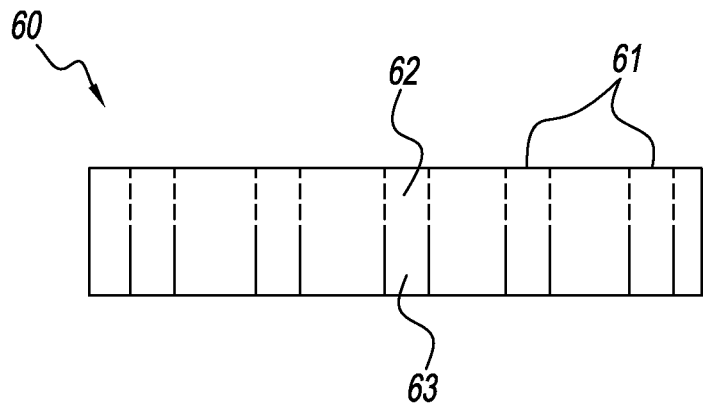
FIGS. 6A-6C show examples of simplified cross-sectional illustrations of glass substrates having through-glass vias.
Figure 6B:
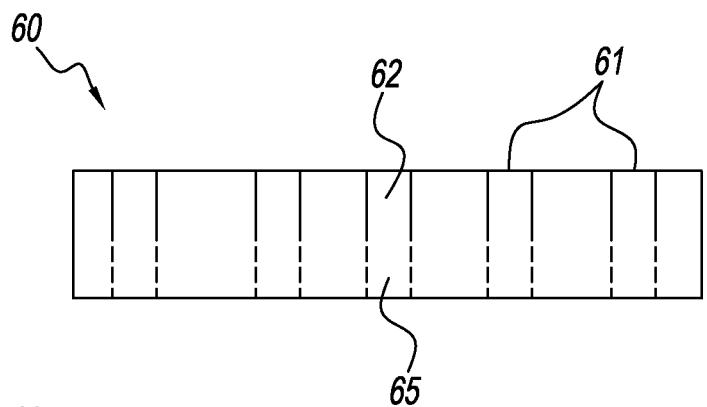
Figure 6C:
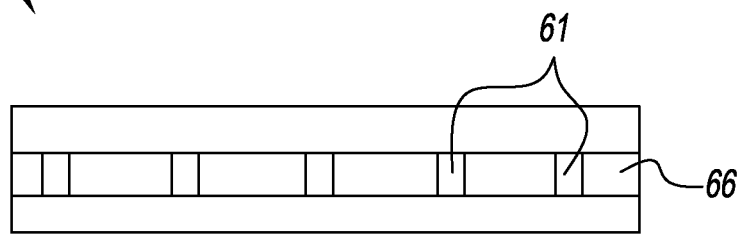

FIGS. 6 and 7 show examples of simplified cross-sectional illustrations of glass substrates having through-glass vias. In FIG. 6A, a front view cross-sectional illustration (along a top channel) of a glass substrate 60 is provided having multiple through-glass vias 61. The top area within the broken lines 62 indicates a direct line-of-sight region in the top channel connecting to the bottom via 63, and together forming a through-glass via hole 61. In FIG. 6B, a side view cross-sectional illustration (along a bottom channel) of a glass substrate 60 is provided having multiple through-glass vias 61. The bottom area within the broken lines 65 indicates a direct line-of-sight region in the bottom channel connecting to the top via 64, and together forming a through-glass via hole 61. In FIG. 6C, a top view illustration of a channel 66 on a glass substrate 60 is provided having multiple through-glass vias 61. The top view is a direct line of sight through the through-glass vias 61.

Figure 7A:
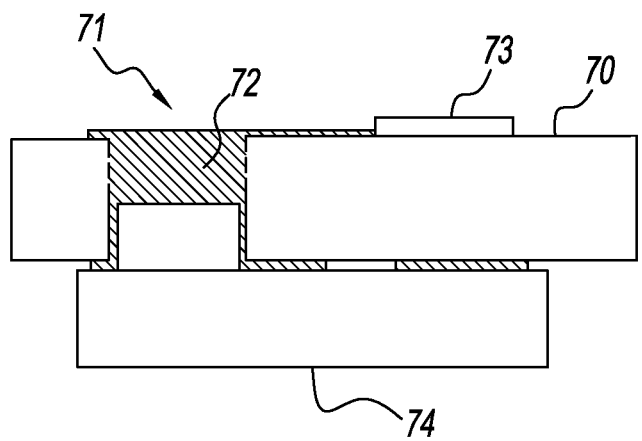
FIGS. 7A-7E show examples of simplified cross-sectional illustrations of glass substrates having through-glass vias.
Figure 7B:
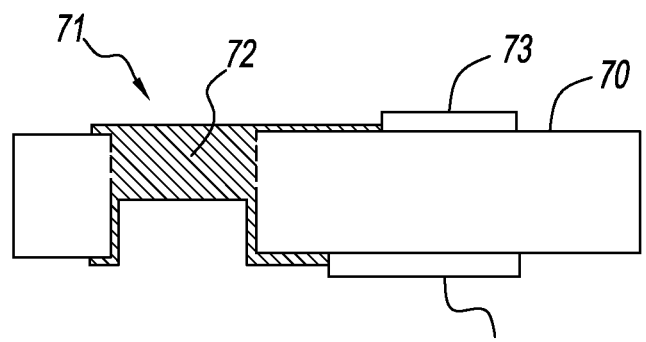
Figure 7C:
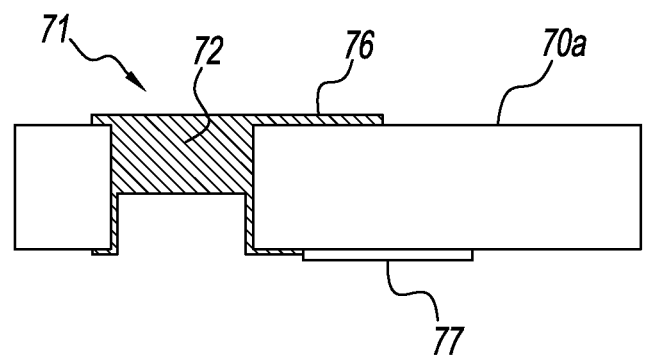
Figure 7D:
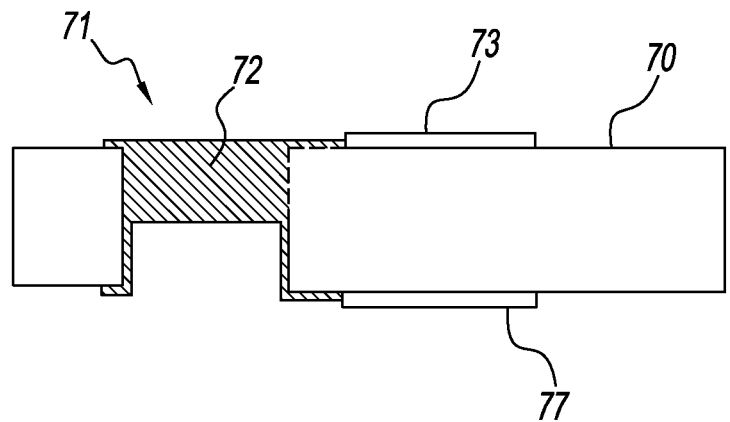
Figure 7E:
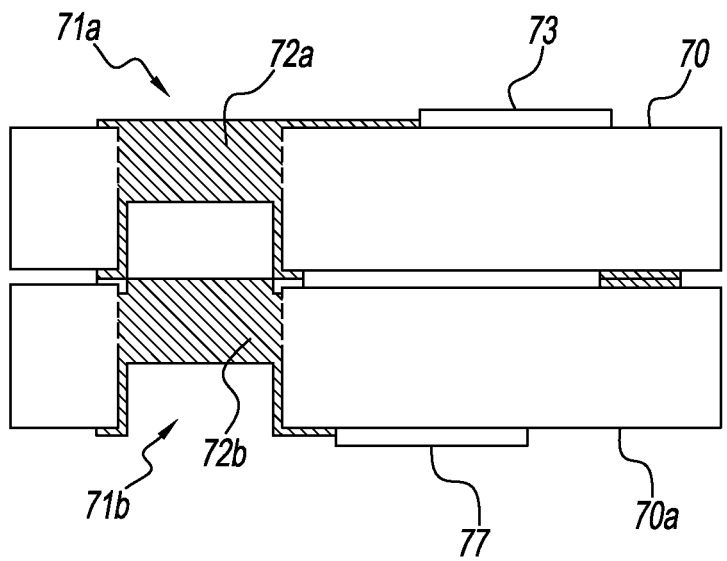

In FIG. 7A, a through-glass via 71, including a conductive thin film 72, is provided in a glass substrate 70, which in this embodiment is a MEMS device glass substrate, i.e., a glass substrate on which a MEMS device 73 is formed or otherwise attached. Conductive thin film 72 of through-glass via 71 provides a conductive pathway through MEMS device glass substrate 70. Accordingly, through-glass via 71 provides an electrical connection between MEMS device 73 on one side of MEMS device glass substrate 70 and a flip-chip bonded integrated circuit 74 on the other side of MEMS device glass substrate 70. In FIG. 7B, a through-glass via 71 also is provided in a glass substrate 70, which is a MEMS device substrate. Through-glass via 71 having a conductive thin film 72 in the via connects a MEMS device 73 on one side of the MEMS device glass substrate 70a to an electrically active component 75 on the other side. Electrically active component 75 may be, for example, an electronic component or a MEMS sensor. In FIG. 7C, a through-glass via 71 is formed in a glass substrate 70a, which can be a surface mount device (SMD) glass substrate, and provides a conductive path between an SMD pad 77 on one side of SMD glass substrate 70a and an electrical trace 76 on the other side. In FIG. 7D, a through-glass via 71 is formed in a MEMS device glass substrate 70 to provide an electrical connection between a MEMS device 73 and an SMD pad 77 on opposite sides of MEMS device glass substrate 70. MEMS device glass substrate 70 may be directly mounted, for example, on a printed circuit board (PCB) with SMD pad 77 providing an electrical interface to the PCB (not shown).

Two or more substrates with at least one substrate having a thin-film through-glass via can be joined together. For example, in FIG. 7E, a through-glass via 71a, including thin film conductive layer 72a, is formed in a MEMS device glass substrate 70, with another through-glass via 71b, including thin film conductive layer 72b, formed in an SMD glass substrate 70a. MEMS device glass substrate 70 and SMD glass substrate 70a are bonded together, e.g., with a metal or a polymer, such as a UV-curable polymer. Through-glass vias 71a and 71b electrically connect MEMS device 73 fabricated on MEMS device glass substrate 70 to SMD pad 77 formed on SMD glass substrate 70a. One or more contact pads may be formed on the bottom surface of MEMS device glass substrate 70 and/or top of surface of SMD pad 77 to connect through-glass vias 71a and 71b. While through-glass vias 71a and 71b are directly aligned in FIG. 7E, in alternate embodiments (not shown) the through-glass vias may not be directly aligned, and may be electrically interconnected with conductive traces and contact pads on one or both substrates.

The through-glass vias may be used to provide a conductive path through any glass substrate. The through-glass vias may be used alone or in connection with contact pads, metal traces, and the like to connect a device, sensor, circuitry, via, contact pad, SMD pad, or other electrically active device or conductive material on one side of a glass substrate to a device, sensor, circuitry, via, contact pad, SMD pad, or other electrically active device or conductive material on the other side of the glass substrate.

The glass substrate in which the via is formed can be substantially planar having substantially parallel major surfaces (also referred to as top and bottom surfaces). One having ordinary skill in the art will understand that each surface may include various recessed or raised features, e.g., to accommodate a MEMS component, an integrated circuit, or other device. The thickness of the glass substrate is typically between about 50 and 700 microns. The substrate thickness may vary according to the desired embodiment. For example, where the glass substrate is a MEMS device substrate that is to be further packaged, the thickness may be between about 50 and 300 microns, such as 100 microns or 300 microns. Substrates that include SMD pads and are configured to mount onto a PCB may have thicknesses of at least about 300 microns, e.g., between about 300 and 500 microns. Configurations that include one or more glass substrates or panels may have thicknesses of 700 microns or more.

The through-glass vias described herein may be unfilled or filled. Filled vias may be partially or substantially filled. Partially filled vias are vias in which fill material is present in the via hole, but an unfilled path is present through the via hole. Substantially filled vias include fill material such that there is no unfilled path through the via hole.

The through-glass vias have a via opening on each side of the substrate, and a continuous conductive path from one via opening to the other. In some embodiments, a dimension of the via openings (e.g., diameter or width) is on the order of the substrate thickness or larger. Preferably, the through-glass vias have a via opening dimension (diameter) of about the same magnitude as the thickness of glass substrate. Sizes of through-glass vias can vary according to application.

Figure 8:
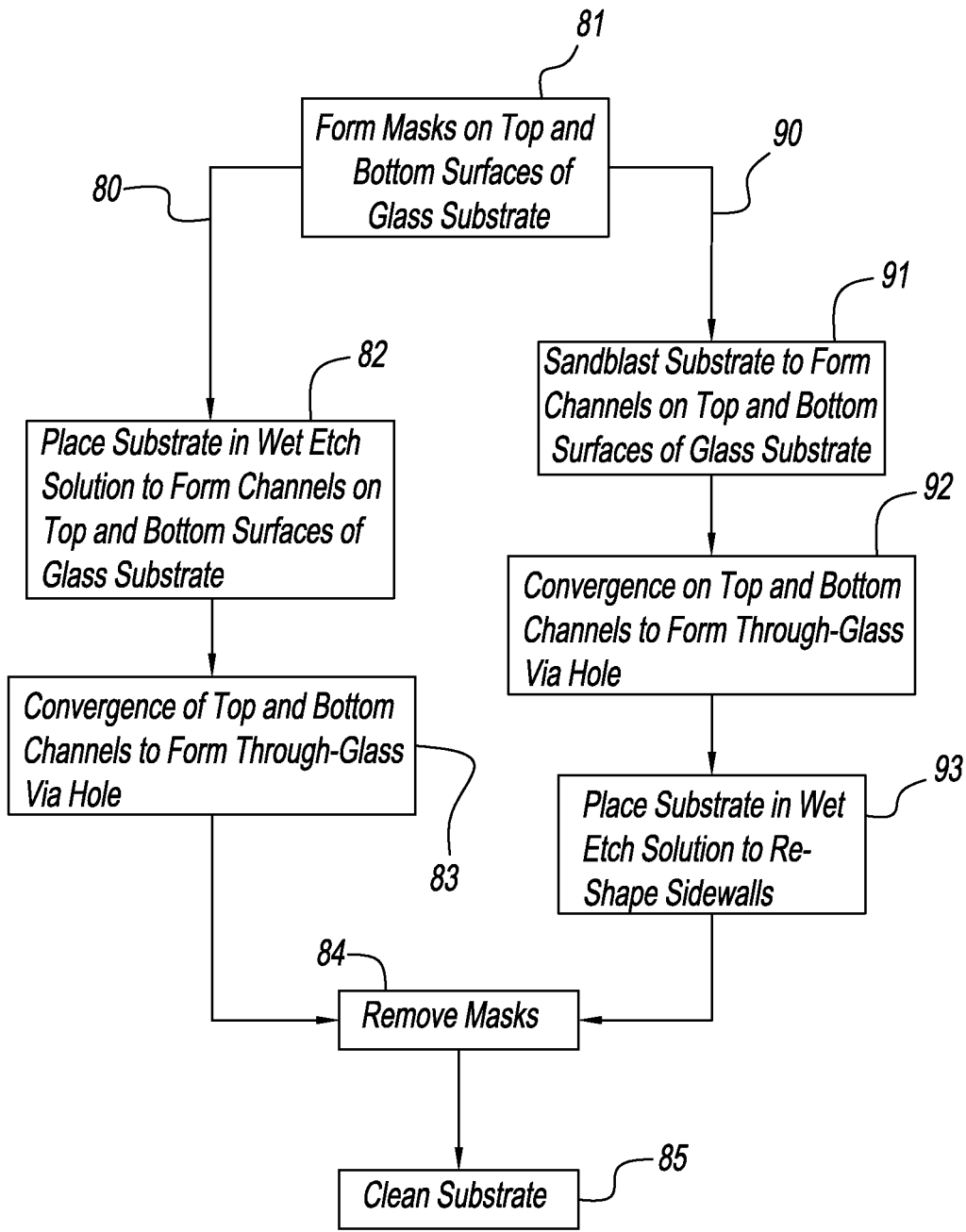
FIG. 8 is a flow diagram illustrating two processes for forming a through-glass via that involve double-sided channeling to form aligned holes in a glass substrate with the holes together forming a through-glass via hole.

FIG. 8 shows an example of a flow diagram illustrating processes of this disclosure for forming through-glass via holes. The flow diagram depicts examples of alternative double-sided channeling methods 80 and 90 of forming through-glass via holes according to various embodiments. Both methods begin with forming masks on the top and bottom surfaces of the glass substrate in an operation 81. The glass substrate may be provided with or without MEMS devices and/or other components already fabricated on one or both sides of the substrate. Alternatively, MEMS and other devices may be formed during or after formation of the through-glass vias. Forming a mask generally involves applying a photo-sensitive layer on the glass substrate, exposing a pattern lithographically into the photo-sensitive layer, and then developing the photo-sensitive layer. Alternatively, an etch-resistant layer deposited on the glass substrate can be patterned and etched, and then serve as an etch mask. Stencils or other masking techniques may also be used as masks for wet, dry, or sandblasting operations. The masks are formed to correspond to the placement and size of the channels (e.g., via holes). In some embodiments, the masks on the top and bottom surfaces are mirror images, with mask openings on either side of the substrate aligned to allow formation of aligned partially through via holes and the subsequent through-glass via hole. To form a through-glass via hole having differently sized via openings on the top and bottom side of the substrate, differently sized aligned mask openings in the masks may be formed.

For isotropic removal processes such as isotropic wet chemical etches, the mask openings can be substantially smaller than the eventual desired via opening size. For example, for a circular via opening having a 100 micron diameter, the mask opening may be as small as about 1-20 microns, e.g., 10 microns; for a circular via opening having a 500 micron diameter, the mask opening may be about 10-100 microns, etc. For anisotropic removal processes such as sandblasting or dry etching, the mask opening is generally on the size of the eventual desired via opening size. As described herein, the eventual via opening size is on the order of the substrate thickness.

The processes also allow some tolerance in the alignment. Because the via openings are fairly large with diameters or lengths on the order of hundreds of microns, corresponding mask openings may be aligned within tens of microns or less. One or both of the top and bottom masks also may have non-corresponding mask openings to allow formation of recessed features other than the double-sided via holes in addition to the double-sided holes.

The mask material may be selected depending on the subsequent glass removal operation, i.e., wet-etching or sandblasting. For wet etching, mask materials may include photoresist, deposited layers of polysilicon or silicon nitride, silicon carbide, or thin metal layers of chrome, chrome and gold, or other etch-resistant material. For sandblasting, mask materials include photoresist, a laminated dry-resist film, a compliant polymer, a silicone rubber, a metal mask, or a metal or polymeric screen.

After the top and bottom surfaces are appropriately masked, the through-glass via holes are formed. In method 80, this involves placing the substrate in a wet etch solution as shown in operation 82. Wet etch solutions include hydrogen fluoride based solutions, e.g., concentrated hydrofluoric acid (HF), diluted HF (HF:$H_2O$), buffered HF (HF:$NH_4F$:$H_2O$), or other suitable etchant with reasonably high etch rate of the glass substrate and high selectivity to the masking material. The etchant also may be applied by spraying, puddling, or other known techniques. The wet etch sequence may be performed consecutively on one side and then the other, or on both sides simultaneously. In method 80, the channels (e.g., through-glass via holes) are formed in the glass entirely by wet etching, without a previous sandblast or other post-masking glass removal operation. This forms a partially through-via hole and the process continues at least until aligned via holes formed in the top and bottom surfaces break through to create a through-glass via hole. Regardless of the via opening shape, each of the aligned holes of a contoured through-glass via hole has sidewalls extending from the planar glass substrate surface to a point in the interior of the glass at which the aligned holes meet. For example, a suitably contoured sidewall allows line-of-sight sputter deposition of a thin metal layer through the via to provide continuous electrical connectivity, even with a single-sided deposition.

In FIG. 8, according to various embodiments, wet etching operation 82 is performed to form a through-glass via hole so as to facilitate subsequent deposition of a continuously conductive thin film. For example, in some embodiments, the wet etching operation is performed such that the intersection of the channels (e.g., aligned via holes) is formed to permit deposition of a continuous thin film from only a single side. A smooth profile allows uniform, non-shadowed coverage of the exposed sidewalls with a deposited thin film.

As described herein, wet etching operation 82 involves simultaneous double-sided etching. In alternate embodiments, the top and bottom sides of the glass substrate may be etched sequentially. At 83, the convergence of the top and bottom channels form the through-glass via holes in the glass substrate. Once the through-glass via is etched, the masks are removed from both sides of the glass substrate as shown in operation 84. The substrate is then cleaned in an operation 85 to prepare the substrate for deposition of continuous thin films in the through-glass via holes and other subsequent processing.

Method 90 describes operations in alternative embodiments of forming through-glass via holes. After the top and bottom surfaces of a glass substrate are masked in operation 81, the substrate is sandblasted to form channels (e.g., through-glass via holes) in an operation 91. The channels (e.g., through-glass via holes) may be formed by sandblasting each side of the substrate through, for example, aligned stencil patterns on one or both sides of the substrate. Masking and sandblasting each side may be performed simultaneously or consecutively.

The sandblasting operation proceeds at least until channeling (aligned via holes formed) in the top and bottom surfaces break through to create through-glass via holes. In some embodiments in which the sandblasting operation is succeeded by a wet etch, the double-sided sandblasting of the channels (e.g., aligned via holes) may stop before breakthrough, with breakthrough occurring during the wet etch. For example, sandblasting may be performed through small-diameter mask openings that self-limit the depth of sandblasting from each side prior to wet etching. Alternatively, sandblasting can be performed for a pre-specified or pre-determined time and stopped prior to breakthrough, with breakthrough occurring during the wet etch. Double-sided sandblasting can be performed past breakthrough to form a through-glass via hole, followed by a wet etch to further contour the through-glass via hole.

After double-sided sandblasting, the resulting through-glass via hole is exposed to a wet etchant in operation 92. The wet etchant serves only to re-texture the sidewalls, smoothing them for subsequent depositions. The wet etch is allowed to continue to contour the through-glass via.

After wet etch operation 92 is performed, method 90 ends similarly to method 80, e.g., by removing the masks from both sides of the glass substrate in operation 84 and cleaning the substrate in operation 85. The wet etch or sandblast operations may be replaced by a dry etch or a combination of dry etching and wet etching. Dry etching involves exposing the masked substrate to a plasma, such as, a fluorine-containing plasma. The plasma may be direct (in situ) or remote. Examples of plasmas that may be used include inductively-coupled or capacitively-coupled RF plasmas and microwave plasmas.

The through-glass via hole may be contoured, i.e., shaped and sized, to allow deposition of a thin film on the sidewalls that is continuous through the hole. The through-glass via hole may be contoured to allow single-sided deposition of a thin film that is continuous through the hole.

EXAMPLES

Referring to FIG. 5, a glass substrate 50 having a crude mask 51 of paraffin wax was formed on the top surface and orthogonally on the bottom surface of a glass substrate, followed by a glass etch step. An etched channel 52 on the bottom and an etched channel 53 on the top met at a point of intersection (the confluence point), and a through-glass via 54 was formed.

The present disclosure has been described herein with reference to numerous embodiments and specific examples. Many variations will suggest themselves to those skilled in this art in light of the above detailed description. All such obvious variations are within the full intended scope of the appended claims.

What is claimed is:

1. A method of forming a through-glass via hole, said method comprising:
providing a glass substrate having first and second substantially planar parallel surfaces, wherein the glass substrate has a thickness of at least about 20 microns;
masking the first and second substantially planar parallel surfaces to form a via-patterned portion thereon; and
etching the via-patterned portion on the first and second substantially planar parallel surfaces to form a first channel in the first substantially planar parallel surface and a second channel in the second substantially planar parallel surface,
wherein the first channel and second channel are substantially orthogonal to one another, and
wherein the first channel and the second channel intersect to form a quadrilateral through-glass via hole having via openings at the first and second substantially planar parallel surfaces.

2. The method of claim 1, further comprising forming a plurality of first channels in the first substantially planar parallel surface and a plurality of second channels in the second substantially planar parallel surface.

3. The method of claim 2, further comprising forming a plurality of through-glass via holes in the glass substrate.

4. The method of claim 3, further comprising filling the plurality of through-glass via holes with precision beads or rods of a conductive material.

5. The method of claim 3, further comprising filling the plurality of through-glass via holes with precision beads or rods of a conductive material with the use of a vibration table.

6. The method of claim 1, wherein forming the first and second channels includes exposing the first and second planar parallel surfaces to a wet etchant to form the first channel in the first surface and the second channel in the second surface.

7. The method of claim 1, wherein the through-glass via hole has substantially vertical sidewalls.

8. The method of claim 1, further comprising coating at least a portion of the through-glass via hole with a conductive thin film that is continuous through the via hole from the first surface to the second surface.

9. The method of claim 8, wherein the conductive thin film has a thickness that is between about 0.1 and 5 microns.

10. The method of claim 1, further comprising eliminating any remaining masking material used in the formation of the via-patterned portion.

11. The method of claim 1, further comprising mounting at least one of a MEMS or IC device on the first surface of the glass substrate and electrically connecting the MEMS or IC device to the conductive thin film in the through-glass via hole.

12. The method of claim 11, further comprising mounting an electrical component on the second surface of the glass substrate, wherein at least one of the MEMS or IC device is electrically connected to the electrical component through the conductive thin film in the through-glass via hole.

13. The method of claim 1, further comprising filling the through-glass via hole with precision beads or rods of a conductive material.

14. The method of claim 1, further comprising filling the through-glass via hole with precision beads or rods of a conductive material with the use of a vibration table.

15. An electrical device comprising:
a glass substrate having first and second substantially planar parallel surfaces, wherein the glass substrate has a thickness of at least about 20 microns;
a first channel in the first substantially planar parallel surface and a second channel in the second substantially planar parallel surface,
wherein the first channel and second channel are substantially orthogonal to one another, and
wherein the first channel and the second channel intersect to form a quadrilateral through-glass via hole having via openings at the first and second substantially planar parallel surfaces.

16. The electrical device of claim 15, further comprising a plurality of first channels in the first substantially planar parallel surface and a plurality of second channels in the second substantially planar parallel surface.

17. The electrical device of claim 16, further comprising a plurality of through-glass via holes in the glass substrate.

18. The electrical device of claim 17, wherein the plurality of through-glass via holes are filled with precision beads or rods of a conductive material.

19. The electrical device of claim 17, wherein the plurality of through-glass via holes are filled with precision beads or rods of a conductive material with the use of a vibration table.

20. The electrical device of claim 15, wherein the first and second channels are formed by exposing the first and second planar parallel surfaces to a wet etchant to form the first channel in the first surface and the second channel in the second surface.

21. The electrical device of claim 15, wherein the through-glass via hole has substantially vertical sidewalls.

22. The electrical device of claim 15, further comprising a coating on at least a portion of the through-glass via hole with a conductive thin film that is continuous through the via hole from the first surface to the second surface.

23. The electrical device of claim 15, wherein the thickness of the conductive thin film is between about 0.1 and 5 microns.

24. The electrical device of claim 15, further comprising at least one of a MEMS or IC device mounted on the first surface of the glass substrate that is electrically connected to the conductive thin film in the through-glass via hole.

25. The electrical device of claim 24, further comprising an electrical component mounted on the second surface of the glass substrate, wherein at least one of the MEMS or IC device is electrically connected to the electrical component through the conductive thin film in the through-glass via hole.

26. The electrical device of claim 15, comprising an interposer.

27. The electrical device of claim 15, wherein the through-glass via hole is filled with precision beads or rods of a conductive material.

28. The electrical device of claim 15, wherein the through-glass via hole is filled with precision beads or rods of a conductive material with the use of a vibration table.

\* \* \* \* \*